(12) United States Patent
Luk et al.

(10) Patent No.: US 11,099,065 B2
(45) Date of Patent: Aug. 24, 2021

(54) METHOD AND SYSTEM FOR BALANCING OPTICAL RECEIVER

(71) Applicant: Ciena Corporation, Hanover, MD (US)

(72) Inventors: Tom Luk, Ottawa (CA); Christopher Falt, Nepean (CA); Sean Sebastian O'Keefe, Dunrobin (CA)

(73) Assignee: Ciena Corporation, Hanover, MD (US)

( * ) Notice: Subject to any disclaimer, the term of this patent is extended or adjusted under 35 U.S.C. 154(b) by 326 days.

(21) Appl. No.: 16/267,436

(22) Filed: Feb. 5, 2019

(65) Prior Publication Data

US 2019/0170574 A1 Jun. 6, 2019

Related U.S. Application Data

(63) Continuation of application No. 14/933,692, filed on Nov. 5, 2015, now Pat. No. 10,209,127.

(51) Int. Cl.
| | |
|---|---|
| *G01J 1/44* | (2006.01) |
| *H04B 10/69* | (2013.01) |
| *G01J 1/42* | (2006.01) |
| *H03F 3/08* | (2006.01) |
| *H03F 3/45* | (2006.01) |

(52) U.S. Cl.
CPC .............. *G01J 1/44* (2013.01); *G01J 1/4228* (2013.01); *H03F 3/08* (2013.01); *H03F 3/45076* (2013.01); *H04B 10/6931* (2013.01); *G01J 2001/444* (2013.01); *G01J 2001/4406* (2013.01); *H03F 2200/144* (2013.01)

(58) Field of Classification Search
CPC .... G01J 1/44; G01J 1/4228; G01J 2001/4406; G01J 2001/444; H03F 2200/144; H03F 3/08

See application file for complete search history.

(56) References Cited

U.S. PATENT DOCUMENTS

| 4,972,515 A | 11/1990 | Shibutani |
| 2005/0237882 A1 | 10/2005 | Honobe |
| 2015/0256266 A1 | 9/2015 | Duthel et al. |

(Continued)

FOREIGN PATENT DOCUMENTS

| EP | 1779558 A1 | 5/2007 |
| WO | 2006020682 A1 | 2/2006 |
| WO | 2012078169 A1 | 6/2012 |

OTHER PUBLICATIONS

Mar. 1, 2017, Extended European Search Report issued in the European Patent Application No. 16196637.9.

(Continued)

*Primary Examiner* — Que Tan Le
*Assistant Examiner* — Don J Williams
(74) *Attorney, Agent, or Firm* — Clements Bernard Walker; Lawrence A. Baratta, Jr.; Christopher L. Bernard

(57) ABSTRACT

A method and system, in an optical receiver, includes receiving a first photocurrent from a first photodetector and a second photocurrent from a second photodetector; amplifying the first photocurrent with a first amplifier to provide a first output signal and the second photocurrent with a second amplifier to provide a second output signal; adjusting a frequency response of a first path the first photocurrent and a second path of the second photocurrent; and determining a difference between the adjusted first photocurrent and the adjusted second photocurrent.

20 Claims, 6 Drawing Sheets

(56) References Cited

U.S. PATENT DOCUMENTS

2015/0295660 A1    10/2015  Suzuki
2016/0238442 A1*   8/2016   Griffith ..................... G01J 1/44

OTHER PUBLICATIONS

OIF, Optical Internetworking Forum, Implementation Agreement for Integrated Dual Polarization Micro-Intradyne Coherent Receivers, IA # OIF-DPC-MRX-01.0, Mar. 31, 2015, pp. 1-32.

* cited by examiner

METHOD AND SYSTEM FOR BALANCING OPTICAL RECEIVER

CROSS-REFERENCE TO RELATED APPLICATION(S)

The present patent/application is a continuation of U.S. patent application Ser. No. 14/933,962, filed Nov. 5, 2015, and entitled "Method and system for balancing optical receiver," the contents of which are incorporated by reference herein.

BACKGROUND

Optical networks may transfer data over light waves. For example, a particular light wave may be generated at an optical transmitter and forwarded over an optical network to an optical receiver. Using an optical protocol, various light waves may be multiplexed using different frequency channels for transmission through the same transmission medium to various optical receivers. At the optical receivers, the light waves may be decoded into electrical signals.

SUMMARY

In general, in one aspect, embodiments relate to a system for balancing an optical receiver circuit that includes a photodetector circuit. The photodetector circuit includes a first photodetector, a second photodetector. The system further includes a transimpedance amplifier circuit that is coupled to the photodetector circuit. The transimpedance amplifier circuit includes a first input terminal that obtains a first photocurrent from the first photodetector. The transimpedance amplifier circuit further includes a second input terminal that obtains a second photocurrent from the second photodetector. The transimpedance amplifier circuit further includes an amplifier that outputs, using the first photocurrent and the second photocurrent, a first output signal and a second output signal. The transimpedance amplifier circuit further includes a transimpedance gain controller that reduces a difference in photodetector responsivity at the amplifier between the first photodetector and the second photodetector. The transimpedance amplifier circuit further includes a frequency response controller that matches a first frequency response of a first photocurrent path from the first photodetector to a second frequency response of a second photocurrent path from the second photodetector.

In general, in one aspect, embodiments relate to a transimpedance amplifier circuit that includes a first input terminal that obtains a first photocurrent from a first photodetector in a photodetector circuit. The transimpedance amplifier circuit further includes a second input terminal that obtains a second photocurrent from a second photodetector in the photodetector circuit. The transimpedance amplifier circuit further includes an amplifier that outputs, using the first photocurrent and the second photocurrent, a first output signal and a second output signal. The transimpedance amplifier circuit further includes a transimpedance gain controller that reduces a difference in photodetector responsivity at the amplifier between the first photodetector and the second photodetector.

In general, in one aspect, embodiments relate to a method. The method includes transmitting an optical noise signal to a first photodetector and a second photodetector within an optical receiver circuit that includes a transimpedance amplifier circuit. The method further includes measuring, in response to transmitting the optical noise signal, a power output from the optical receiver circuit. The method further includes determining, using the power output, a difference in photodetector responsivity between the first photodetector and the second photodetector. The method further includes adjusting, using a transimpedance gain controller, an amplifier gain within the optical receiver circuit to decrease a difference in photodetector responsivity between the first photodetector and the second photodetector.

Other aspects of the invention will be apparent from the following description and the appended claims.

DETAILED DESCRIPTION

Figure 1:
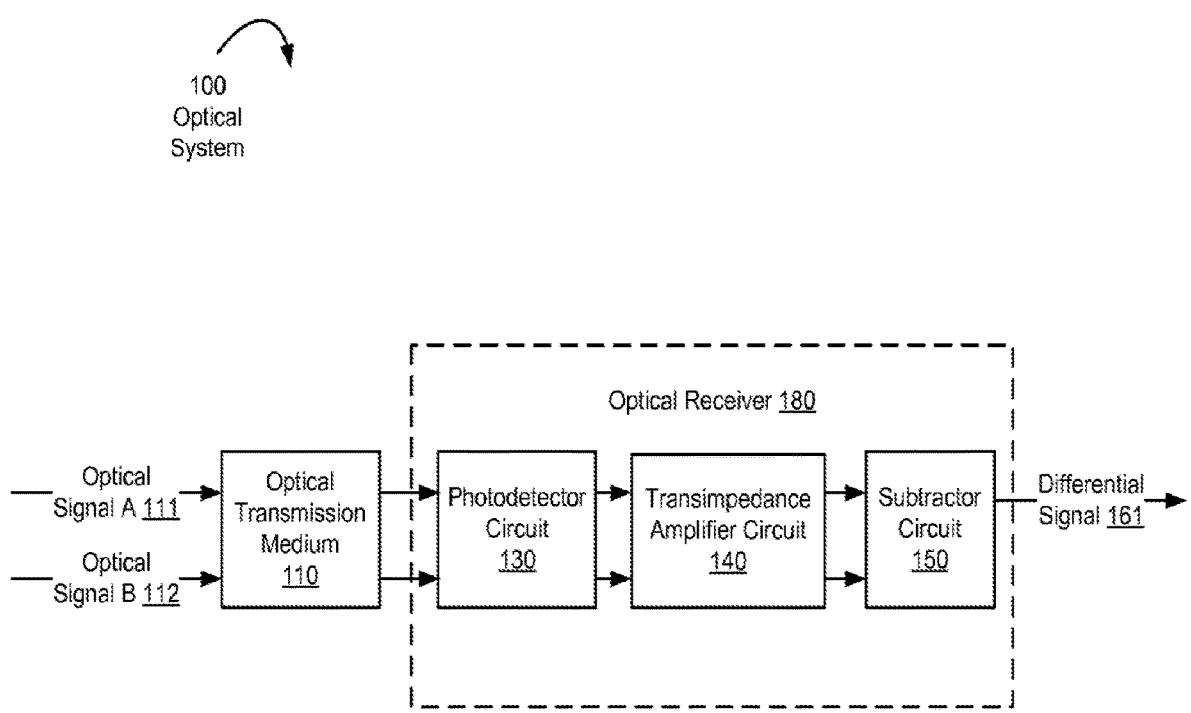
FIGS. 1, 2, and 3 show systems in accordance with one or more embodiments.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

In general, embodiments of the invention include a system, a transimpedance amplifier circuit, and a method for balancing an optical receiver circuit. In particular, one or more embodiments are directed to a system that includes one or more transimpedance gain controllers that adjust the amounts of amplifier gain between input terminals and output terminals of an amplifier in a transimpedance amplifier circuit. By adjusting the amounts of amplifier gain, the system may account for a difference in photodetector responsivity at the amplifier. One or more embodiments are also directed to a system that includes one or more frequency response controllers that adjust the frequency response of a photocurrent path between a photodetector in a photodetector circuit and an amplifier in a transimpedance amplifier circuit. Thus, the frequency response controllers may reduce any differences in frequency responses produced by differences in the interface traveled by photocurrent from a photodetector to a terminal of an amplifier in the transimpedance amplifier circuit.

FIG. 1 shows a block diagram of a system in accordance with one or more embodiments. In one or more embodiments, as shown in FIG. 1, an optical system (100) includes an optical transmission medium (110) and an optical receiver (180). The optical receiver (180) may include a photodetector (PD) circuit (130), a transimpedance amplifier (TIA) circuit (140), a subtractor circuit (150), and various other components such as a local oscillator (not shown) or an optical signal amplifier (not shown). Specifically, various optical signals (e.g., optical signal A (111), optical signal B (112)) may be transmitted over the optical transmission medium (110) to the optical receiver (180). The optical transmission medium (110) may be a type of physical medium, such as a single mode optical fiber, that is configured to transport the optical signals (111, 112) from an optical transmitter (not shown) to the optical receiver (180). Thus, the optical receiver (180) may decode the optical signals (111, 112) and output a differential signal (161) using the subtractor circuit (150).

In one or more embodiments, the photodetector circuit (130) may include various photodetectors configured to generate various photocurrents in response to the optical signals (111, 112). In one or more embodiments, for example, the photodetector circuit (130) is a hardware electrical circuit, e.g., a portion of an integrated circuit with electrical and/or optical components, with the photodetectors embedded or attached to the integrated circuit. A photocurrent may be a direct current (DC) produced by a photodetector in response to an input voltage applied across the photodetector while the photodetector receives an optical signal.

The TIA circuit (140) may be a portion of an integrated circuit that may also include a transimpedance amplifier. Specifically, the TIA circuit (140) may be a current-to-voltage converter. In other words, the TIA circuit (140) may generate a pair of output voltages as a function of the current inputs to the TIA circuit (140). Thus, the TIA circuit (140) may obtain the photocurrents from the photodetector circuit (130) to generate respective voltage signals at the output of the amplifiers (241, 242).

The subtractor circuit (150) may produce the differential signal (161) from a pair of voltage signals outputted by the TIA circuit (140). Specifically, the pair of voltage signals may be signals outputted by the TIA circuit (140) in response to the optical signals (111, 112) obtained from the optical transmission medium (110). Thus, the differential signal (161) produced by the subtractor circuit (150) may be a signal identifying the difference between the pair of voltage signals.

Figure 2:
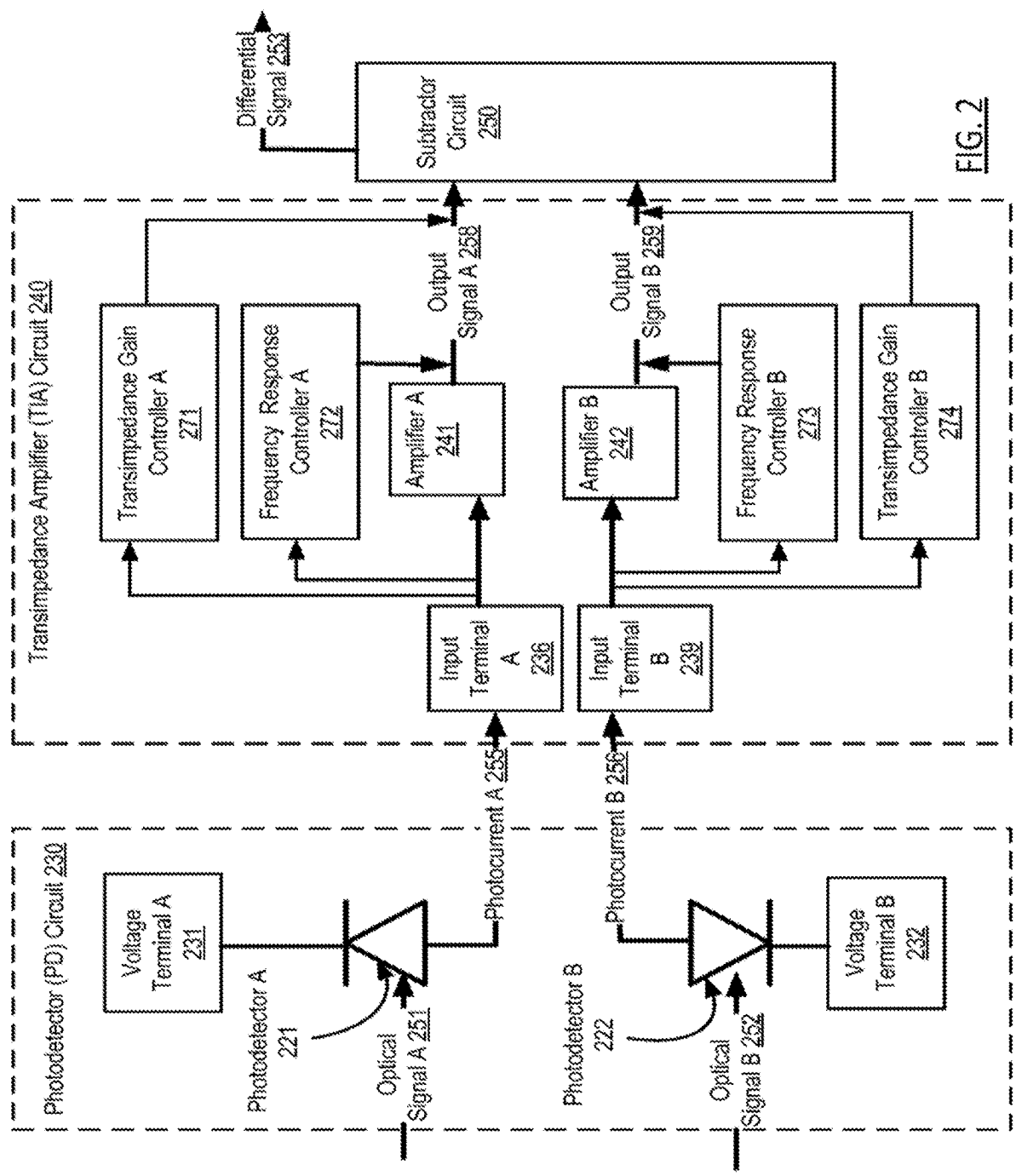

Turning to FIG. 2, FIG. 2 shows a block diagram of a system in accordance with one or more embodiments. In FIG. 2, the system includes a photodetector circuit (230), a TIA circuit (240), and a subtractor circuit (250). In particular, the photodetector circuit (230) may include various photodetectors (e.g., photodetector A (221), photodetector B (222)), various voltage terminals (e.g., voltage terminal A (231), voltage terminal B (232)), and other circuit components such as capacitors, resistors, amplifiers, etc. For example, the photodetectors (221, 222) may be photodiodes. In some embodiments, one or more of the photodetectors (221, 222) may be other types of photosensors such as photosensors based on photoemissive or photovoltaic materials.

The voltage terminals (231, 233) may be circuit terminals coupled to a power supply (not shown) and configured to provide a voltage signal. Thus, the photodetector circuit (230) may obtain voltage from the voltage terminals (231, 232) for applying across the photodetectors (221, 222). In response to various optical signals (e.g., output signal A (258), output signal B (259)) impacting the photodetectors (221, 222) respectively, various photocurrents (e.g., photocurrent A (255), photocurrent B (256)) are generated and transmitted to the TIA circuit (240).

Keeping with FIG. 2, the TIA circuit (240) may include various input terminals (e.g., input terminal A (236), input terminal B (239)) that obtain the photocurrents (255, 256) from the photodetector circuit (230) for various amplifiers (e.g., amplifier A (241), amplifier B (242)). Thus, the amplifiers (241, 242) may use the photocurrents (255, 256) to produce the output signals (258, 259) for the subtractor circuit (250). While two amplifiers are shown in FIG. 2, in one or more embodiments, a single amplifier includes two input terminals for obtaining the photocurrents (255, 256). Thus, a single amplifier may be used to produce the output signals (258, 259). At the subtractor circuit (250), a voltage difference may be determined between the output signals (258, 259), which the subtractor circuit (250) may output as a differential signal (253).

In one or more embodiments, the TIA circuit (240) includes various transimpedance gain controllers (e.g., transimpedance gain controller A (271), transimpedance gain controller B (274)). Specifically, a transimpedance gain controller may be physical hardware and/or software configured to produce a control signal within the TIA circuit (240) between the input terminals and output terminals of the amplifiers (241, 242). The control signal may result from a change in circuit characteristics (e.g., resistance values, capacitance values, etc.) that affect an amount of amplifier gain within the TIA circuit (240). In one or more embodiments, for example, the control signal from the transimpedance gain controller A (271) adjusts the amplifier gain (e.g., the DC voltage gain) between photocurrent A (255) and the corresponding output signal A (258). Likewise, the control signal from the transimpedance gain controller B (274) may adjust the amplifier gain between photocurrent B (256) and the corresponding output signal B (259).

In one or more embodiments, the transimpedance gain controller A (271) adjusts the amplifier gain between input signals and output signals of the amplifiers (241, 242) to reduce a difference in photodetector responsivity between photodetector A (221) and photodetector B (222). In particular, photodetector responsivity may describe a relationship between an amount of photocurrent produced by each photodetector (221, 222) in response to a particular power intensity of an optical signal. In other words, the photodetector with a higher photodetector responsivity may produce more photocurrent than the photodetector with lower photodetector responsivity for the same optical signal intensity. In one or more embodiments, the transimpedance gain controllers (271, 274) are configured to reduce the difference in photodetector responsivity between the photodetectors (221, 222).

In one or more embodiments, the photodetector responsivity of the photodetectors (221, 222) corresponds to a specific common-mode rejection ratio (CMRR) within an optical receiver. Specifically, the CMRR may describe the degree to which an optical receiver rejects common-mode signals at the input of the TIA circuit (240) that do not match the frequency of a local oscillator. For example, an optical signal having a frequency that matches the frequency of the local oscillator may produce a differential signal amplified by the amplifier gain of the amplifiers (241, 242). On the other hand, optical signals at different frequencies may be rejected by the amplifiers (241, 242). Accordingly, the CMRR may depend on the precision that the photocurrent A (255) and photocurrent B (256) are matched at the input terminals of the amplifiers (241, 242).

While a TIA circuit may include two or more transimpedance gain controllers as shown in FIG. 2, in one or more embodiments, a single transimpedance gain controller is located inside the TIA circuit (240), e.g., to generate the specific common-mode rejection ratio. While the transimpedance gain controllers (271, 274) are shown inside the TIA circuit (240) in FIG. 2, in one or more embodiments, one or both of the transimpedance gain controllers (271, 274) are disposed outside the TIA circuit (240).

In one or more embodiments, for example, a transimpedance gain controller is implemented using a variable resistor. Thus, the transimpedance controller may change a resistance value between an input terminal of the amplifiers (241, 242) and an output signal from the amplifiers (241, 242). Accordingly, the resistance value may be changed based on the desired amplifier gain sought in order to reduce the difference in photodetector responsivity. As such, the variable resistor may be automatically controlled by a computing device (not shown). In other embodiments, other combinations and/or types of circuit components may be used to adjust the transimpedance gain between an input terminal of the amplifiers (241, 242) and an output signal from the amplifiers (241, 242).

In one or more embodiments, the TIA circuit (240) includes various frequency response controllers (e.g., frequency response controller A (272), frequency response controller B (273)). Specifically, a frequency response controller may be physical hardware and/or software configured to adjust the frequency response of a photocurrent path within the TIA circuit (240). In particular, a frequency response may describe the output of the amplifiers (241, 242) for a range of alternating current (AC) frequencies for a particular photocurrent path. Furthermore, a photocurrent path may include a path from one of the photodetectors (221, 222) to a respective terminal of the amplifiers (241, 242). Thus, different photocurrent paths may have different frequency responses due in part to differences between the PD-TIA interface (e.g., physical differences in bond wires coupling the photodetector circuit (230) and the TIA circuit (240)) between the photodetector circuit (230) and the input terminals (236, 239) of the TIA circuit (240). Likewise, the photocurrent paths may also produce different frequency responses due to different parasitic characteristics (e.g., parasitic resistances) of each of the photodetectors (221, 222) and/or different optical and electrical path delays of each photocurrent path.

In one or more embodiments, the CMRR performance of an optical receiver is affected by a mismatch between frequency responses for different photocurrent paths. Thus, reducing the difference between frequency responses may improve the CMRR performance of an optical receiver.

In one or more embodiments, for example, a frequency response controller is implemented using a variable capacitor in series with a resistor. Thus, the frequency response controller may change a particular impedance value between an input terminal of the amplifiers (241, 242) and an output signal from the amplifiers (241, 242) in order to change a particular frequency response. As such, the variable capacitor may be automatically controlled by a computing device (not shown). In other embodiments, other combinations and/or types of circuit components may be used to adjust the frequency response of a photocurrent path between a photodetector and an input terminal of the amplifiers (241, 242).

Furthermore, in one or more embodiments, a frequency response controller is configured to produce a control signal within the TIA circuit (240) that adjusts the frequency response of a photocurrent path from a photodetector to a terminal of the amplifiers (241, 242). The control signal may correspond to a change in circuit characteristics (e.g., resistance values, capacitance values, etc.) that affect the frequency response of a particular photocurrent path. For example, the frequency response controller A (272) may use a control signal to adjust the frequency response from the photodetector A (221) through the input terminal A (236) to the corresponding output signal A (258), while the frequency response controller B (273) may use another control signal to adjust the frequency response from the photodetector B (222) through the input terminal B (239) to the corresponding output signal B (259). Thus, in one or more embodiments, the frequency response controller A (272) and/or frequency response controller B (273) match the frequency response of the photocurrent paths for the input terminal A (236) and the input terminal B (239) of the amplifiers (241, 242).

In one or more embodiments, the control signal from a frequency response controller adjusts a difference in AC equalization peaking between a positive terminal of the amplifiers (241, 242) and a negative terminal of the amplifiers (241, 242). Accordingly, the frequency response controllers (272, 273) may change the location of one or both peaking amplitudes of the frequency responses to remove a difference in peaking amplitudes between the negative terminal and the positive terminal of the amplifiers (241, 242).

While a TIA circuit may include two or more frequency response controllers, in one or more embodiments, a single frequency response controller is located inside the TIA circuit (240). While the frequency response controllers (272, 273) are shown inside the TIA circuit (240) in FIG. 2, in one or more embodiments, one or both of the frequency response controllers (272, 273) are disposed outside the TIA circuit (240).

Figure 3:
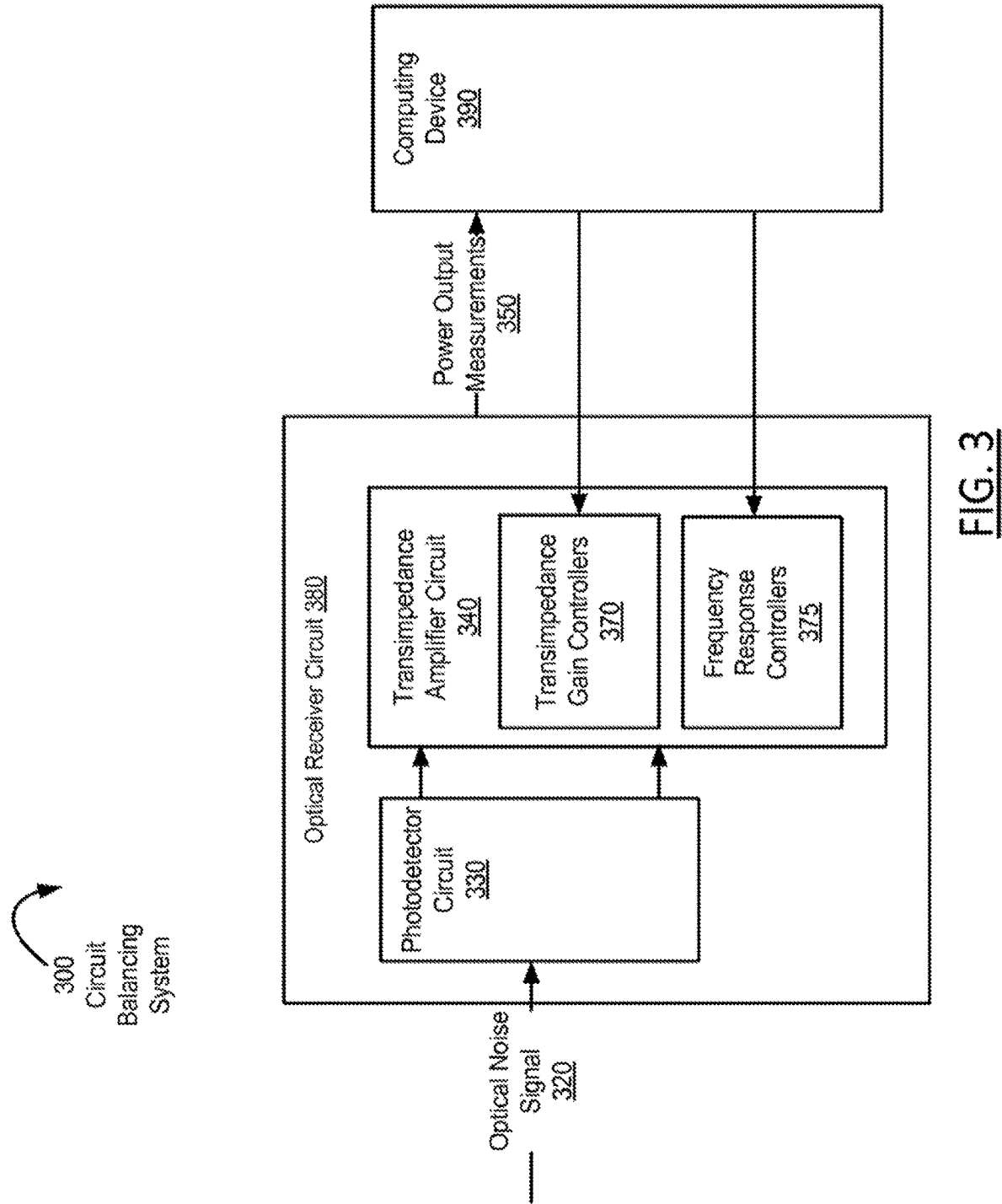

Turning to FIG. 3, a circuit balancing system (300) is shown that may include an optical receiver circuit (380) that includes a photodetector circuit (330) and a TIA circuit (340) having various transimpedance gain controllers (370) and various frequency response controllers (375). In one or more embodiments, the circuit balancing system (300) may include a computing device (390) coupled to the transimpedance gain controllers (370) and the frequency response controllers (375) located inside the TIA circuit (340). For example, the computing device (390) may be a microcontroller or a computing system as described with respect to FIG. 6 and the accompanying description below.

In one or more embodiments, the computing device (390) is configured to adjust the transimpedance gain for one or more photocurrents inside the transimpedance amplifier circuit (340) using the transimpedance gain controllers (370). In one or more embodiments, the computing device (390) is configured to adjust the frequency response of one or more photocurrent paths between photodetectors in the photodetector circuit (330) using the frequency response controllers (375). In one or more embodiments, a computing device configured to adjust the transimpedance gain or the frequency response of a photocurrent path is located inside the transimpedance gain controllers (370) and/or the frequency response controllers (375), respectively. In one or more embodiments, for example, the computing device is implemented as firmware within a transimpedance gain controller and/or a frequency response controller.

In one or more embodiments, the computing device (390) is configured to obtain power output measurements (350) from the optical receiver circuit (380). In one or more embodiments, the power output measurements (350) include digital root-mean-square (RMS) measurements from a digital signal processing (DSP) application specific integrated circuit (ASIC) within the optical receiver circuit (380). In one or more embodiments, the power output measurements (350) are analog RMS measurements from an output of the optical receiver circuit (380), e.g., from the transimpedance amplifier circuit (340). In one or more embodiments, for example, the power output measurements (350) are obtained in response to an optical noise signal (320) that is transmitted to photodiodes (not shown) in the photodetector circuit (330).

While one computing device (390) is shown in FIG. 3, the computing device (390) may include separate computing devices, e.g., one computing device configured to obtain the power output measurements (350) and another computing device configured to adjust a transimpedance gain and/or frequency response within the optical receiver circuit (380). For example, the computing device (390) may be an electric power meter. For more information on the computing device (390), see FIG. 6 and the accompanying description below.

Figure 4:
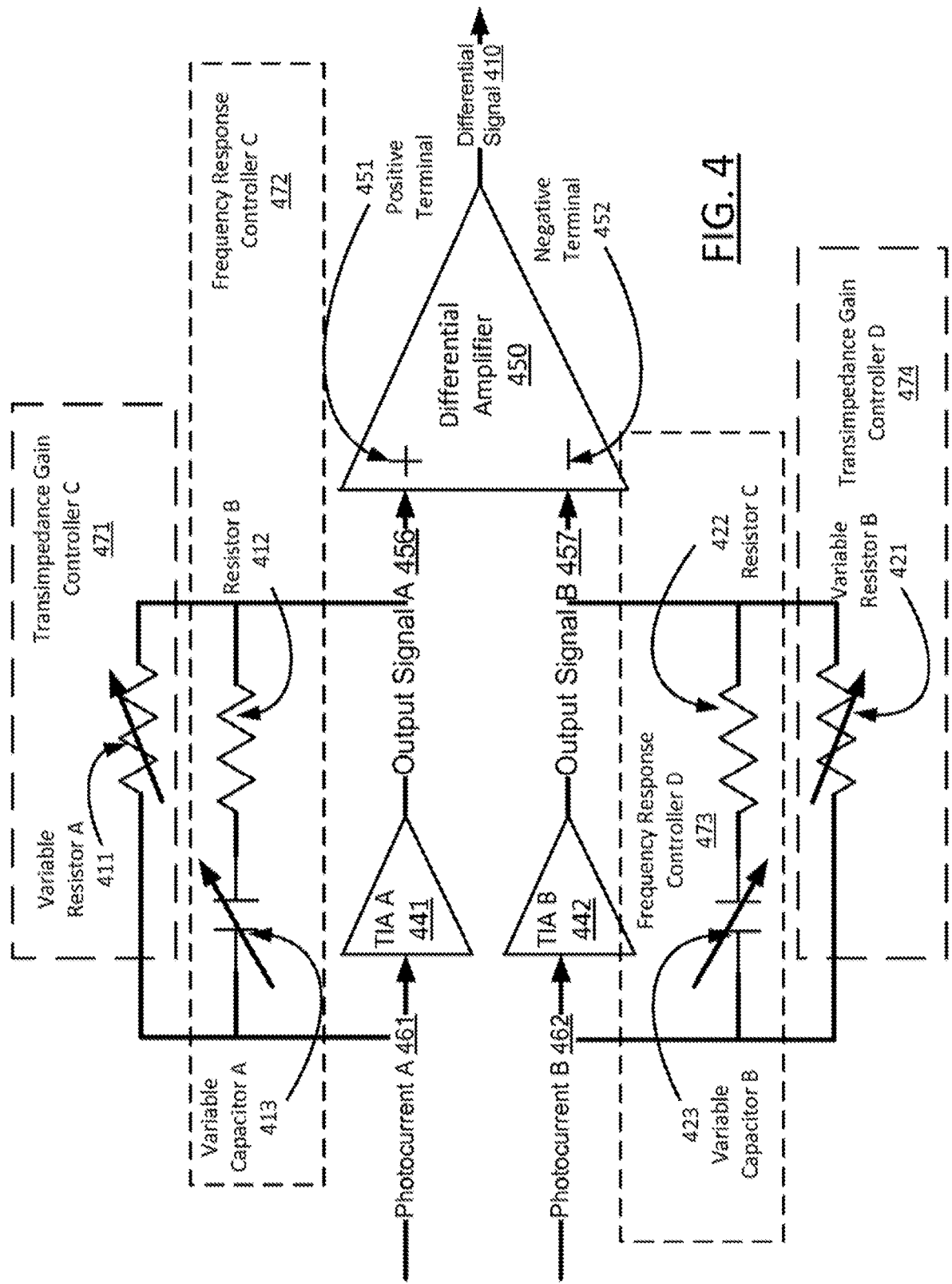
FIG. 4 shows an example in accordance with one or more embodiments.

FIG. 4 provides an example of circuit balancing system. The following example is for explanatory purposes only and not intended to limit the scope of the invention. Turning to FIG. 4, FIG. 4 illustrates a transimpedance amplifier A (441) and a transimpedance amplifier B (442) that interface with a differential amplifier (450). Specifically, the transimpedance amplifier A (441) obtains a photocurrent A (461) for generating output signal A (456), and the transimpedance amplifier B (442) obtains photocurrent B (462) for generating output signal B (457). Accordingly, the transimpedance amplifiers (441, 442) produce a pair of output signals that are obtained by the differential amplifier (450) at positive terminal (451) and negative terminal (452). Accordingly, one of the output signals (456, 457) may be an inverted signal, while the other one of the output signals (456, 457) may a non-inverted signal. Thus, the differential amplifier (450) produces a differential signal (410).

Keeping with FIG. 4, various transimpedance gain controllers (i.e., transimpedance gain controller C (471), transimpedance gain controller D (474)) are implemented through various physical circuits. As shown, the transimpedance gain controller C (471) is implemented using a variable resistor A (411), while the transimpedance gain controller D (474) is implemented using a variable resistor B (421). Thus, one or more computing devices (not shown) may adjust the resistance values within the transimpedance gain controllers (471, 474) to adjust the transimpedance gain of the transimpedance amplifiers (441, 442). Accordingly, the transimpedance gain produced by a DC current at the positive terminal A (441) may be matched to a transimpedance gain produced by a DC current at the negative terminal B (442).

Furthermore, various frequency response controllers (i.e., frequency response controller C (472), frequency response controller D (473)) are implemented through various physical circuits. As shown, the frequency response controller C (472) is implemented using a variable capacitor A (413) and a resistor B (412) in series, while the frequency response controller D (473) is implemented using a variable capacitor B (423) and a resistor C (422) in series. Thus, one or more computing devices (not shown) may change the capacitance values within the frequency response controllers (472, 473). Accordingly, changing the capacitance values may adjust the reactance within the circuit balancing system in FIG. 4 in order to change the frequency response of the positive terminal A (441) and the negative terminal A (442) of the transimpedance amplifier (440). As such, using the frequency response controllers (472, 473), a photocurrent path from a photodetector (not shown) to the positive terminal A (441) may have a matching frequency response of a photocurrent path from another photodetector (not shown) to the negative terminal B (442).

Figure 5:
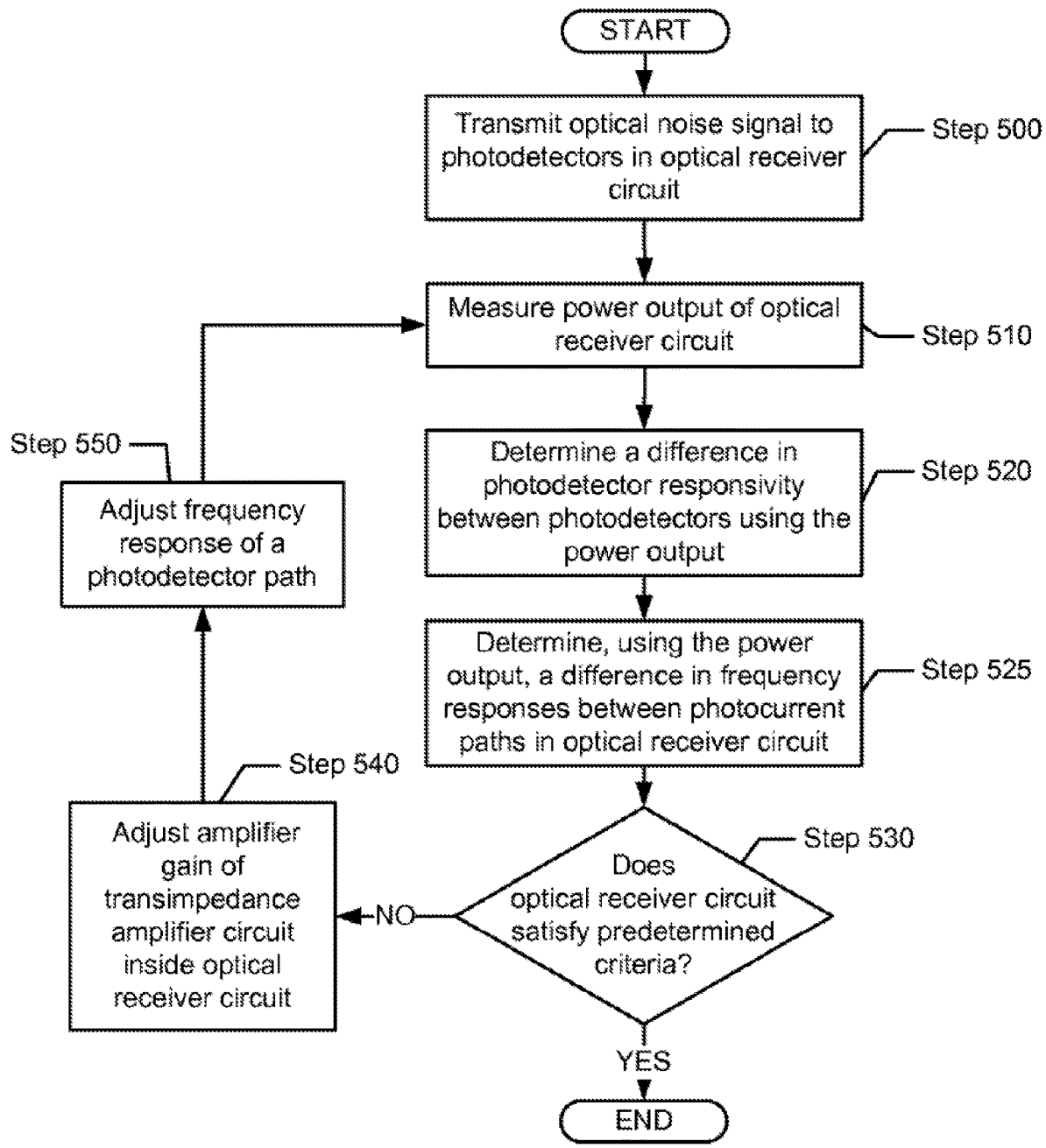
FIG. 5 shows a flowchart in accordance with one or more embodiments.

FIG. 5 shows a flowchart in accordance with one or more embodiments. Specifically, one or more steps in FIG. 5 may be performed by the circuit balancing system as described in FIG. 3. While the various steps in these flowcharts are presented and described sequentially, one of ordinary skill in the art will appreciate that some or all of the steps may be executed in different orders, may be combined or omitted, and some or all of the steps may be executed in parallel. Furthermore, the steps may be performed actively or passively.

In Step 500, an optical noise signal is transmitted to various photodetectors in optical receiver circuit in accordance with one or more embodiments. For example, the optical noise signal may be a common-mode signal, such as produced by an amplified spontaneous emission (ASE) noise source. The optical noise signal may be transmitted to the photodetectors over a signal input provided by an optical receiver circuit for coupling to an optical fiber. Thus, optical noise signals may provide a test for photodetector responsivity within the optical receiver circuit. Likewise, a local oscillator (LO) source may be disabled and/or disconnected from an LO input of the optical receiver circuit during Step 500. As such, optical signals generated by an optical noise source may be transmitted to photodetectors within a photodetector circuit inside the optical receiver.

In Step 510, a power output of an optical receiver circuit is measured in accordance with one or more embodiments. In response to the optical noise signal transmitted in Step 500, for example, a power output may be measured from an optical receiver circuit. In one or more embodiments, for example, a power detector monitors digital RMS power from a digital signal processing application specific integrated circuit within the optical receiver circuit. In one or more embodiments, for example, a power detector is coupled to the signal output of the optical receiver circuit in order to monitor analog RMS power.

In Step 520, a difference in photodetector responsivity between various photodetectors is determined using a power output in accordance with one or more embodiments. In particular, individual photocurrents (i.e., photocurrent produced by one photodetector) and/or the total photocurrent produced by photodetectors are measured using the power output in Step 510. Accordingly, the difference in photodetector responsivity may be calculated from the computed photocurrent values derived from the measured power output. In one or more embodiments, the CMRR is determined for an optical receiver circuit using the power output from Step 510. For example, the CMRR may be the ratio between the current difference between individual photocurrents obtained at a transimpedance amplifier in the optical receiver circuit and the total photocurrent current transmitted to the transimpedance amplifier.

In Step 525, a difference in frequency responses between photocurrent paths in an optical receiver circuit is determined using a power output in accordance with one or more embodiments. Specifically, using the power output measured in Step 510, one or more characteristics of a frequency response, e.g., a peaking amplitude in the frequency response, may be determined for a photocurrent path within the optical receiver circuit.

In Step 530, a determination is made whether the optical receiver circuit satisfies one or more predetermined criteria in accordance with one or more embodiments. In one or more embodiments, for example, the predetermined criteria include a particular difference in photodetector responsivity for an optical receiver. For example, if the difference in photodetector responsivity determined in Step 520 falls within a CMRR specification, then the process may determine that the optical receiver circuit passes the predetermined criteria. On the other hand, a difference in photodetector responsivity outside the CMRR specification may cause the optical receiver circuit to fail the predetermined criteria.

In one or more embodiments, for example, the predetermined criteria include a comparison between frequency responses obtained in Step 525. As such, the predetermined criteria may specify a particular match between a peaking amplitude in one frequency response and a peaking amplitude in another frequency response. If the peaking amplitudes fall outside the specified match, then the process may determine that the optical receiver circuit fails to satisfy the predetermined criteria.

When a determination is made that the optical receiver circuit fails to satisfy the predetermined criteria, the process may proceed to Step 540. When a determination is made that the optical receiver circuit satisfies the predetermined criteria, the process ends.

In Step 540, an amplifier gain is adjusted within a transimpedance amplifier circuit inside an optical receiver circuit in accordance with one or more embodiments. In one or more embodiments, the amplifier gain may be adjusted using one or more transimpedance amplifier controllers as described in FIG. 2 and the accompanying description. Thus, the amplifier gain between one input terminal of an amplifier within the transimpedance amplifier circuit and an output terminal of the amplifier may be modified using a transimpedance gain controller. As such, the adjustment of the transimpedance gain may be performed in order to satisfy the predetermined criteria described in Step 530.

In one or more embodiments, the adjustment in Step 540 is performed using a computing device as shown in FIG. 3. In one or more embodiments, the adjustment is performed automatically based on the difference in photodetector responsivity determined in Step 520.

In Step 550, a frequency response in a transimpedance amplifier circuit is adjusted in accordance with one or more embodiments. The frequency response may correspond to one of the frequency responses determined in Step 525. In one or more embodiments, the frequency response may be adjusted using one or more frequency response controllers as described in FIG. 2 and the accompanying description. As such, the adjustment of the frequency response in Step 550 may be performed in order to satisfy the predetermined criteria described in Step 530.

In one or more embodiments, the adjustment in Step 550 is performed using a computing device as shown in FIG. 3. In one or more embodiments, the adjustment is performed automatically based on one or more characteristics (e.g., peaking amplitudes) of the frequency response determined in Step 525.

In one or more embodiments, a digital signal processing (DSP) device is used to determine the difference in photodetector responsivity in Step 520 or the difference in frequency responses in Step 530. Specifically, a DSP device may capture a sequence of samples, e.g., 214 samples, of a differential signal outputted by a subtractor circuit from an optical receiver. The sequence of samples may be used to perform a Fast Fourier Transform (FFT) with a computing device for determining the frequency response of the optical receiver to the optical noise signal transmitted in Step 500. Accordingly, in one or more embodiments, an average spectral power may be determined from the sequence of samples that corresponds to the frequency response of the optical receiver.

In one or more embodiments, the transimpedance amplifier gain is adjusted in Step 540 until the average spectral power approaches an approximate minimum or converges to a minimum value. In one or more embodiments, the frequency response of the photodetector path is adjusted until the average spectral power approaches the approximate minimum. Thus, when the photodetector responsivity and the frequency responses of two photodetectors are approximately matched, the average spectral power may be at the approximate minimum.

Figure 6:
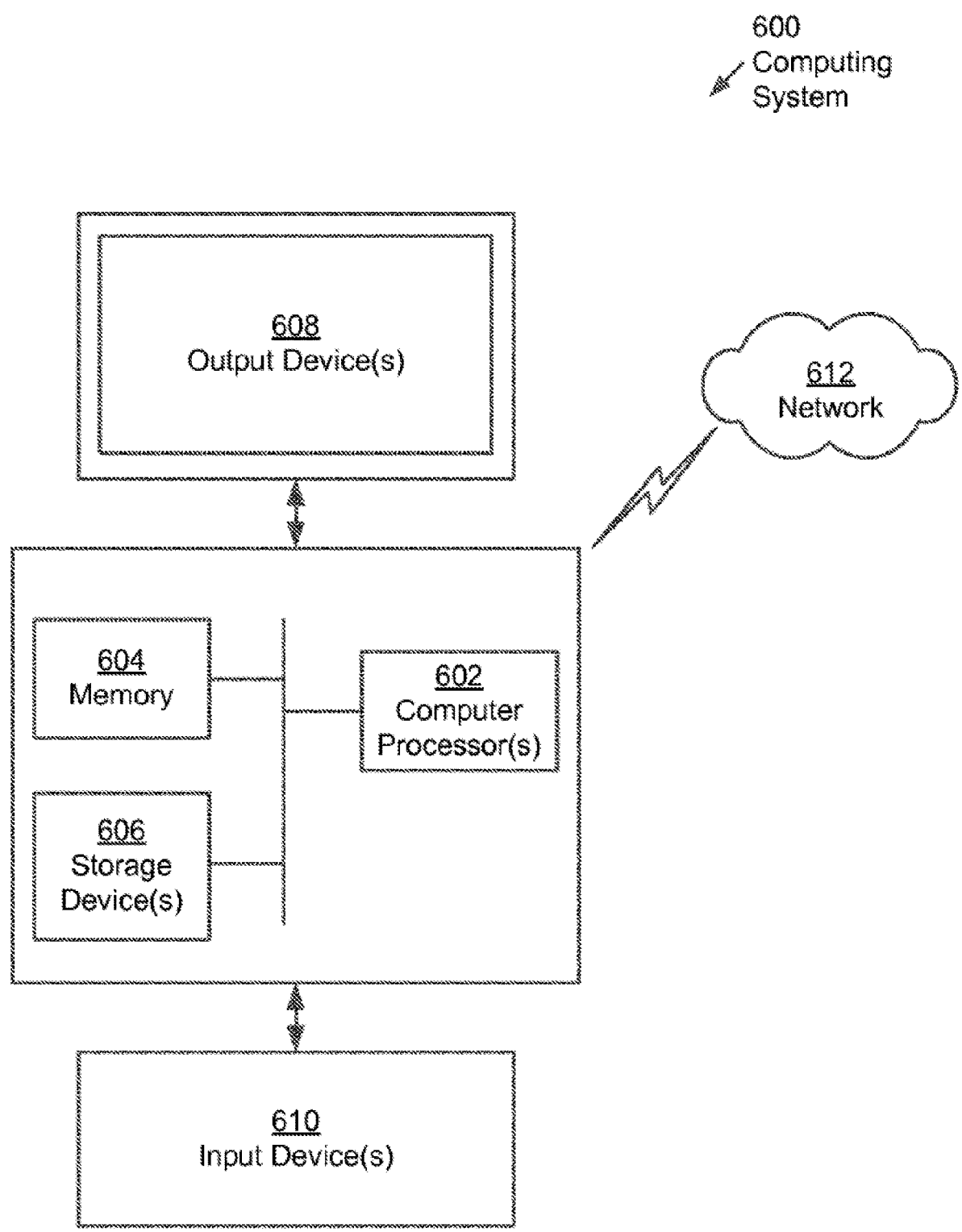
FIG. 6 shows a computing system in accordance with one or more embodiments.

Embodiments of the invention may be implemented on a computing system. Any combination of mobile, desktop, server, embedded, or other types of hardware may be used. For example, as shown in FIG. 6, the computing system (600) may include one or more computer processor(s) (602), associated memory (604) (e.g., random access memory (RAM), cache memory, flash memory, etc.), one or more storage device(s) (606) (e.g., a hard disk, an optical drive such as a compact disk (CD) drive or digital versatile disk (DVD) drive, a flash memory stick, etc.), and numerous other elements and functionalities. The computer processor(s) (602) may be an integrated circuit for processing instructions. For example, the computer processor(s) may be one or more cores, or micro-cores of a processor. The computing system (600) may also include one or more input device(s) (610), such as a touchscreen, keyboard, mouse, microphone, touchpad, electronic pen, or any other type of input device. Further, the computing system (600) may include one or more output device(s) (608), such as a screen (e.g., a liquid crystal display (LCD), a plasma display, touchscreen, cathode ray tube (CRT) monitor, projector, or other display device), a printer, external storage, or any other output device. One or more of the output device(s) may be the same or different from the input device(s). The computing system (600) may be connected to a network (612) (e.g., a local area network (LAN), a wide area network (WAN) such as the Internet, mobile network, or any other type of network) via a network interface connection (not shown). The input and output device(s) may be locally or remotely (e.g., via the network (612)) connected to the computer processor(s) (602), memory (604), and storage device(s) (606). Many different types of computing systems exist, and the aforementioned input and output device(s) may take other forms.

Software instructions in the form of computer readable program code to perform embodiments of the invention may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that when executed by a processor(s), is configured to perform embodiments of the invention.

Further, one or more elements of the aforementioned computing system (600) may be located at a remote location and connected to the other elements over a network (612). Further, embodiments of the invention may be implemented on a distributed system having a plurality of nodes, where each portion of the invention may be located on a different node within the distributed system. In one embodiment of the invention, the node corresponds to a distinct computing device. Alternatively, the node may correspond to a computer processor with associated physical memory. The node may alternatively correspond to a computer processor or micro-core of a computer processor with shared memory and/or resources.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims

What is claimed is:

1. A method comprising:
in an optical receiver, receiving a first photocurrent from a first photodetector and a second photocurrent from a second photodetector;
amplifying the first photocurrent with a first amplifier to provide a first output signal and the second photocurrent with a second amplifier to provide a second output signal;
adjusting a frequency response between the first photocurrent and the first output signal of a first path and between the second photocurrent and the second output signal of a second path; and
determining a difference between the adjusted first photocurrent and the adjusted second photocurrent.

2. The method of claim 1, wherein the adjusting the frequency response adjusts a location of one or both peaking amplitudes to remove a difference in peaking amplitudes between a negative terminal and a positive terminal of each of the first amplifier and the second amplifier.

3. The method of claim 2, wherein the location of the one or both peaking amplitudes is adjusted to match between the first path and the second path.

4. The method of claim 1, wherein the adjusting the frequency response utilizes a variable capacitor and resistor in series.

5. The method of claim 1, wherein the adjusting the frequency response is performed prior to the determining the difference.

6. The method of claim 1, further comprising:
adjusting gain of the first photocurrent and the second photocurrent.

7. The method of claim 6, wherein the gain is adjusted to reduce a photodetector responsivity between the first photodetector and the second photodetector, wherein the photodetector responsivity corresponds to a specific common-mode rejection ratio (CMRR) within the optical receiver.

8. The method of claim 6, wherein the gain is adjusted via a variable resistor.

9. The method of claim 1, wherein the first path and the second path each produce different frequency responses due to different parasitic characteristics between the first photodetector and the second photodetector.

10. An optical receiver comprising:
a transimpedance amplifier circuit configured to receive a first photocurrent from a first photodetector and a second photocurrent from a second photodetector, and amplify the first photocurrent with a first amplifier to provide a first output signal and the second photocurrent with a second amplifier to provide a second output signal;
a frequency response controller configured to adjust a frequency response between the first photocurrent and the first output signal of a first path and to adjust a frequency response between the second photocurrent and the second output signal of a second path; and
a subtraction circuit configured to determine a difference between the adjusted first photocurrent and the adjusted second photocurrent.

11. The optical receiver of claim 10, wherein the frequency response controller adjusts a location of one or both peaking amplitudes to remove a difference in peaking amplitudes between a negative terminal and a positive terminal of each of the first amplifier and the second amplifier.

12. The optical receiver of claim 11, wherein the location of the one or both peaking amplitudes is adjusted to match between the first path and the second path.

13. The optical receiver of claim 10, wherein the frequency response controller utilizes a variable capacitor and resistor in series.

14. The optical receiver of claim 10, wherein the frequency response controller is located prior to the subtraction circuit.

15. The optical receiver of claim 10, further comprising:
a gain controller configured to adjust gain between the first photocurrent and the second photocurrent while the frequency response controller adjusts the frequency response.

16. The optical receiver of claim 15, wherein the gain is adjusted to reduce a photodetector responsivity between the first photodetector and the second photodetector, wherein the photodetector responsivity corresponds to a specific common-mode rejection ratio (CMRR) within the optical receiver.

17. The optical receiver of claim 10, wherein the gain is adjusted via a variable resistor.

18. The optical receiver of claim 10, wherein the first path and the second path each produce different frequency responses due to different parasitic characteristics between the first photodetector and the second photodetector.

19. A frequency response circuit in an optical receiver comprising:
a first amplifier having a first input and a first output, wherein the first input is configured to receive a first photocurrent from a first photodetector, and wherein the first input and the first output are connected to a first variable capacitor and resistor in series configured to adjust a first frequency response of a first path between the first photocurrent and a first output signal;
a second amplifier having a second input and a second output, wherein the second input is configured to receive a second photocurrent from a second photodetector, and wherein the second input and the second output are connected to a second variable capacitor and resistor in series configured to adjust a second frequency response of a second path between the second photocurrent and the second output signal.

20. The frequency response circuit of claim 19, wherein adjustment of the first frequency response and the second frequency response is to adjust a location of one or both peaking amplitudes to remove a difference in peaking amplitudes between a negative terminal and a positive terminal of each of the first amplifier and the second amplifier, such that the location of the one or both peaking amplitudes matches between the first path and the second path.

* * * * *